United States Patent
Park et al.

(10) Patent No.: US 7,410,892 B2
(45) Date of Patent: Aug. 12, 2008

(54) METHODS OF FABRICATING INTEGRATED CIRCUIT DEVICES HAVING SELF-ALIGNED CONTACT STRUCTURES

(75) Inventors: Hee-Sook Park, Seoul (KR); Gil-Heyun Choi, Gyeonggi-do (KR); Sang-Bom Kang, Seoul (KR); Kwang-Jin Moon, Gyeonggi-do (KR); Hyun-Su Kim, Gyeonggi-do (KR); Seung-Gil Yang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 205 days.

(21) Appl. No.: 11/375,914

(22) Filed: Mar. 15, 2006

(65) Prior Publication Data

US 2006/0194432 A1    Aug. 31, 2006

Related U.S. Application Data

(62) Division of application No. 10/779,440, filed on Feb. 13, 2004, now Pat. No. 7,045,842.

(30) Foreign Application Priority Data

Feb. 17, 2003   (KR) .................. 2003-9926

(51) Int. Cl.
*H01L 21/44* (2006.01)
*H01L 21/4763* (2006.01)

(52) U.S. Cl. .............. 438/598; 438/618; 438/622; 438/639; 257/E21.507; 257/E21.538

(58) Field of Classification Search .......... 257/756, 257/758; 438/598, 618, 622, 639, E21.507, 438/E21.538

See application file for complete search history.

(56) References Cited

U.S. PATENT DOCUMENTS 6,291,335 B1    9/2001   Schnabel et al.

(Continued)

FOREIGN PATENT DOCUMENTS

JP    10-027889    1/1998

(Continued)

OTHER PUBLICATIONS

Office Action, Korean Application No. 10-2003-0009926, Feb. 21, 2005.

*Primary Examiner*—Ngan Ngo
(74) *Attorney, Agent, or Firm*—Myers Bigel Sibley & Sajovec PA

(57) ABSTRACT

An integrated circuit device, e.g., a memory device, includes a substrate, a first insulation layer on the substrate, and a contact pad disposed in the first insulation layer in direct contact with the substrate. A second insulation layer is disposed on the first insulation layer. A conductive pattern, e.g., a damascene bit line, is disposed in the second insulation layer. A conductive plug extends through the second insulation layer to contact the contact pad and is self-aligned to the conductive pattern. An insulation film may separate the conductive pattern and the conductive plug. A glue layer may be disposed between the conductive pattern and the second insulation layer. The device may further include a third insulation layer on the second insulation layer and the conductive pattern, and the conductive plug may extend through the second and third insulation layers.

34 Claims, 14 Drawing Sheets

U.S. PATENT DOCUMENTS

| | | |
|---|---|---|
| 6,344,389 B1 | 2/2002 | Bronner et al. |
| 2007/0012991 A1 * | 1/2007 | Yaegashi .................. 257/315 |

FOREIGN PATENT DOCUMENTS

| | | |
|---|---|---|
| JP | 10027889 | 3/1999 |
| KR | 1020000027544 | 5/2000 |
| KR | 1020010059019 | 7/2001 |
| KR | 1020010076166 | 8/2001 |

* cited by examiner

METHODS OF FABRICATING INTEGRATED CIRCUIT DEVICES HAVING SELF-ALIGNED CONTACT STRUCTURES

CLAIM FOR PRIORITY AND RELATED APPLICATION

This application claims priority to and is a divisional of parent application Ser. No. 10/779,440, filed Feb. 13, 2004, the disclosure of which is hereby incorporated herein by reference, which claims the benefit of Korean Application No. 2003-9926, filed Feb. 17, 2003, the disclosure of which is hereby incorporated herein by reference.

BACKGROUND OF THE INVENTION

The present invention relates to integrated circuit devices and fabrication techniques therefor, and more particularly, to contact structures for integrated circuit devices and methods of fabrication therefor.

Generally, patterns formed in semiconductor devices have decreased in size as the semiconductor devices have become more highly integrated. For example, widths of wirings and intervals between wirings in semiconductor devices have been greatly reduced. In addition, sizes of adjacent structures, as well as the dimensions of bit lines, have been greatly reduced. For example, bit line contacts and self-aligned contact pads have taken on reduced dimensions. Particularly, contacts that connect isolated device regions to one another using a conductive film often consume a considerable area in a semiconductor device because of a need to maintain alignment margins and isolation. As a result, contact size often is a significant factor in determining cell size in a semiconductor memory device, such as a dynamic random access memory (DRAM) device.

As semiconductor manufacturing technology below about 0.25 μm has been developed, conventional methods for forming contacts may not be feasible. In a semiconductor memory device including a plurality of conductive films, interlayer dielectrics are typically interposed between the conductive films. Formation of a contact that electrically connects conductive films to one another generally becomes more difficult as separation between the conductive films increases.

A method for forming a contact using a self-aligned process has been developed in order to reduce an area of a cell in the semiconductor memory device including a repetitive formation of identical patterns and an inadequate design rule. Generally, this conventional method for forming a self-aligned contact uses steps defined by adjacent structures. The contact may have a size that varies in accordance with heights of the adjacent structures, a thickness of an insulation film where the contact is formed, and an etching process used to form the contact. The conventional method for forming a self-aligned contact may be advantageously performed to form a minute contact without requiring precise alignment margin for the contact. A conventional method for forming the self-aligned contact is performed using an etching selectivity between an oxide film and a nitride film during an anisotropic etching process. Examples of such a method are disclosed in Korean Patent Laid Open Publication No. 2001-76166, Japanese Patent Laid Open Publication No. 10-27889, and Korean Patent Laid Open Publication No. 2001-59019.

FIGS. 1A to 1C are cross-sectional views illustrating a method for forming a self-aligned contact according to the disclosure in Japanese Patent Laid Open Publication No. 10-27889.

Referring to FIG. 1A, after an oxide film 15 is formed on a semiconductor substrate 10 having a transistor structure formed thereon, the oxide film 15 is partially etched to form a groove 20 for a bit line having a predetermined dimension. A first metal barrier layer 25 and a first conductive film 30 are successively formed on the oxide film 15 and in the groove 20. The metal barrier layer 25 and the first conductive film 30 are partially etched to form a bit line 35 in the groove 20.

Referring to FIG. 1B, after a nitride capping layer 40 is formed on the bit line 35, the oxide film 15 between the bit lines 35 is etched using a photoresist pattern as an etching mask to form a contact hole 45 adjacent to the bit line 35. Nitride spacers 50 are formed on a sidewall of the bit line 35, on a side portion of the capping layer 40 and on a sidewall of the contact hole 45.

Referring to FIG. 1C, a contact plug 65 is formed between the bit line 35 by forming a second metal barrier layer 55 and a second conductive film 60 in the contact hole 45. Because the contact hole is formed using the capping layer composed of nitride as a hard mask, a size of the contact hole is decreased and a processing margin for opening the contact may not be ensured when a critical dimension (CD) of the bit line is reduced to below about 100 nm. As a result, a void may be formed in the contact plug because the contact hole may not be completely filled up with the conductive material. Additionally, metallic hard polymer may be generated during etching processes for forming the bit line and the contact hole. The metallic hard polymer may cause an electrical short of a semiconductor device, e.g., the metallic hard polymer may form a bridge connecting one bit line to an adjacent bit line or the contact plug.

To overcome the above-described problems, a method for forming a bit line and a capacitor contact using a damascene process is disclosed in U.S. Pat. No. 6,344,389 (issued to Gary B. Bronner et. al.), Korean Patent Laid Open Publication No. 2001-8589 and Korean Patent Laid Open Publication No. 2001-55683.

FIGS. 2A to 2E are cross-sectional views illustrating a method for manufacturing a semiconductor device having a bit line and a capacitor contact using a damascene process according to the disclosure in U.S. Pat. No. 6,344,389.

Referring to FIG. 2A, an isolation film 105 is formed on a semiconductor substrate 100 using a shallow trench isolation (STI) process to define a cell region and a peripheral circuit region in the semiconductor substrate 100. After a protection layer 115 is formed to enclose a transistor 110 on the semiconductor substrate 100, a first insulation film 120 is formed on the semiconductor substrate 100. The first insulation film 120 may include silicon oxide or silicon nitride.

After an upper portion of the first insulation film 120 is planarized using a chemical-mechanical polishing (CMP) process, the first insulation film 120 is partially etched using a photolithography process to form holes (not shown) that expose source/drain regions 125 of the transistors 110. When the holes are filled with conductive materials like polysilicon or tungsten silicide, a self-aligned contact (SAC) pad 130 of a bit line and a SAC pad 135 of a capacitor are formed.

Referring to FIG. 2B, after an interlayer dielectric (ILD) 140 is formed on the first insulation film 120 including the SAC pads 130 and 135 of the bit line and the capacitor, the interlayer dielectric 140 is etched to form a capacitor contact hole (not shown) exposing the SAC pad 135 of the capacitor. The capacitor contact hole is partially filled with a conductive material like polysilicon or tungsten silicide to from a capacitor contact 145. A protection layer 150 is formed on the capacitor contact 145. A portion of the ILD 140 adjacent to the capacitor contact 145 is partially etched to form a trench 155. Spacers 160 are formed on sidewalls of the trench 155 of the ILD 140. The spacers 160 may include an insulation material, such as silicon nitride.

Referring to FIG. 2C, a bottom of the trench 155 is partially etched to form a bit line contact hole (not shown) exposing the SAC pad 130 of the bit line. A conductive material is formed in the trench 155. After the conductive material is polished in a damascene process, a dry etching process or a wet etching process is performed to form a bit line contact 165 in the bit line contact hole and a bit line 170 having a predetermined thickness is formed in the trench 155.

Referring to FIG. 2D, a second insulation film 175 is formed on the ILD 140, the capacitor contact 145 and the bit line 170. The second insulation film 175 is partially etched to form an opening 180 exposing an upper portion of the capacitor contact 145. Referring to FIG. 2E, a portion of the protection layer 150 and the upper portion of the capacitor contact 145 are removed through the opening 180. A bottom electrode, a dielectric region and a top electrode are successively formed in the opening 180, thereby forming a capacitor 185. Portions of the second insulation film 175 and the ILD 140 around the capacitor 185 are etched using a CMP process to form a semiconductor device having a capacitor-over-bit line (COB) structure.

In the above-described method for forming the semiconductor device, a parasitic capacitor including the bit line, the spacer and the contact plug may be formed. A capacitance of the parasitic capacitor may be relatively high because the nitride spacer has a relatively large dielectric constant of more than about 8. Consequently, the transient response of the semiconductor device may be reduced and a capacitance of the capacitor may be reduced. Additionally, the processes for forming and etching the protection layer may increase manufacturing cost and manufacturing time because the protection layer is removed with a portion of the capacitor contact after the protection layer is formed on the capacitor contact. Furthermore, metal hard polymers may be generated during etching of the protection layer, and these metal hard polymers may cause failure of the semiconductor device. The metal hard polymers may be more frequently generated when the bit line is formed by etching the conductive material.

SUMMARY OF THE INVENTION

According to some embodiments of the present invention, an integrated circuit device includes a substrate, a first insulation layer on the substrate, and a contact pad disposed in the first insulation layer in direct contact with the substrate. A second insulation layer is disposed on the first insulation layer. A conductive pattern, e.g., a damascene bit line, is disposed in the second insulation layer. A conductive plug extends through the second insulation layer to contact the contact pad and is self-aligned to the conductive pattern. An insulation film may separate the conductive pattern and the conductive plug. A glue layer may be disposed between the conductive pattern and the second insulation layer. The device may further include a third insulation layer on the second insulation layer and the conductive pattern, and the conductive plug may extend through the second and third insulation layers.

According to further embodiments of the present invention, an integrated circuit memory device includes a substrate having a source/drain region therein. A first insulation layer is disposed on the substrate, and a storage node contact pad is disposed in the first insulation layer and directly contacts the source/drain region. A second insulation layer is disposed on the first insulation layer. First and second damascene bit lines are disposed in respective trenches in the second insulation layer on opposite sides of the storage node contact pad. A conductive plug extends through the second insulation layer between the first and second damascene bit lines to contact the storage node contact pad. The conductive plug is self-aligned to the first and second bit lines. A capacitor is disposed on the conductive plug. The memory device may further include respective glue layers disposed between respective ones of the first and second bit lines and the second insulation layer.

According to some method aspects of the present invention, an integrated circuit device is fabricated. A first insulation layer is formed on a substrate. A contact pad is formed in the first insulation layer in direct contact with the substrate. A second insulation layer is formed on the first insulation layer. A conductive pattern is formed in the second insulation layer. A conductive plug is then formed extending through the second insulation layer to contact the contact pad, self-aligned to the conductive pattern.

In some embodiments, a third insulation layer is formed on the second insulation layer and the conductive pattern. The conductive plug is formed by etching the second and third insulation layers to form a contact hole that exposes the contact pad and a sidewall of the conductive pattern, forming an insulation film lining the contact hole, removing a portion of the insulation film on the contact pad to expose the contact pad; and forming the conductive plug in the contact hole on the exposed contact pad. For example, a conductive material may be deposited on the substrate, filling the contact hole, and the substrate may then be planarized to form the conductive plug.

In further embodiments, forming a conductive pattern may comprise forming a trench in the second insulation layer, depositing a conductive material on the substrate and in the trench, and planarizing the substrate to form the conductive pattern in the second insulation layer. Depositing of the conductive material may be preceded by forming a glue layer in the trench.

According to additional method aspects of the present invention, an integrated circuit memory device is fabricated. A source/drain region is formed in a substrate. A first insulation layer is formed on the substrate. A storage node contact pad is formed in the first insulation layer and in contact with the source/drain region. A second insulation layer is formed on the first insulation layer. First and second damascene bit lines are formed in respective trenches in the second insulation layer on opposite sides of the storage node contact pad. A conductive plug is formed extending through the second insulation layer between the first and second damascene bit lines to contact the storage node contact pad. The conductive plug is self-aligned to the first and second bit lines. A capacitor is formed on the conductive plug.

In some embodiments, formation of the conductive plug is preceded by forming a third insulation layer on the second insulation layer and the first and second bit lines. The second and third insulation layers are etched to form a contact hole that exposes the storage node contact pad and sidewalls of the first and second bit lines. An insulation film lining the contact hole is formed, and a portion of the insulation film on the storage node contact pad is removed to expose the storage node contact pad. The conductive plug is formed in the contact hole on the exposed storage node contact pad. For example, a conductive material may be deposited on the substrate, filling the contact hole, and the substrate may then be planarized to form the conductive plug.

DETAILED DESCRIPTION OF EMBODIMENTS

Figure 1A:
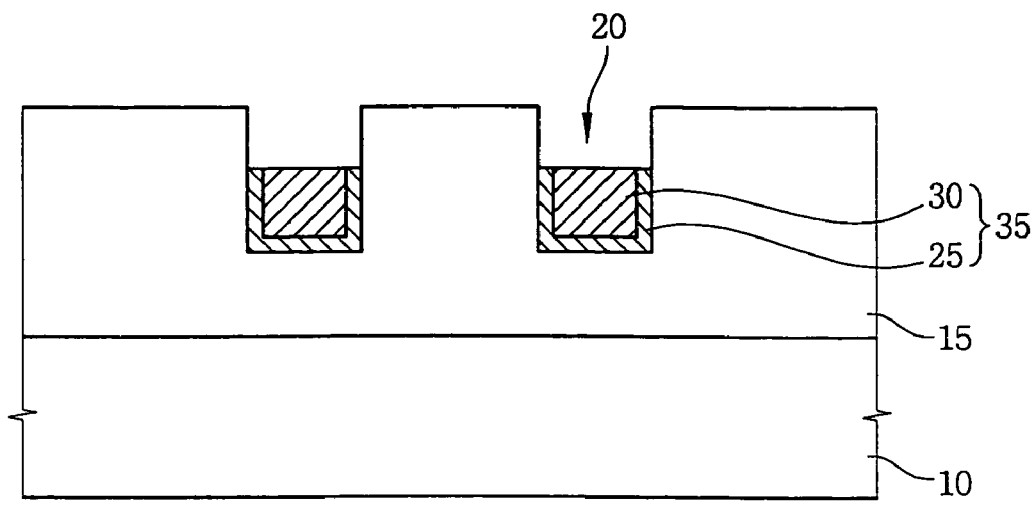
FIGS. 1A through 1C are cross-sectional views illustrating a conventional method for forming a contact.
Figure 1B:
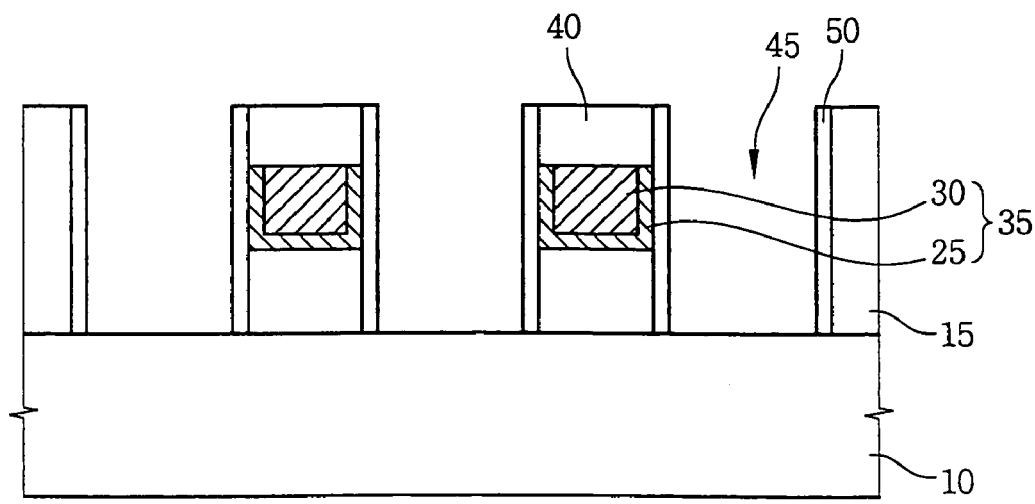
Figure 1C:
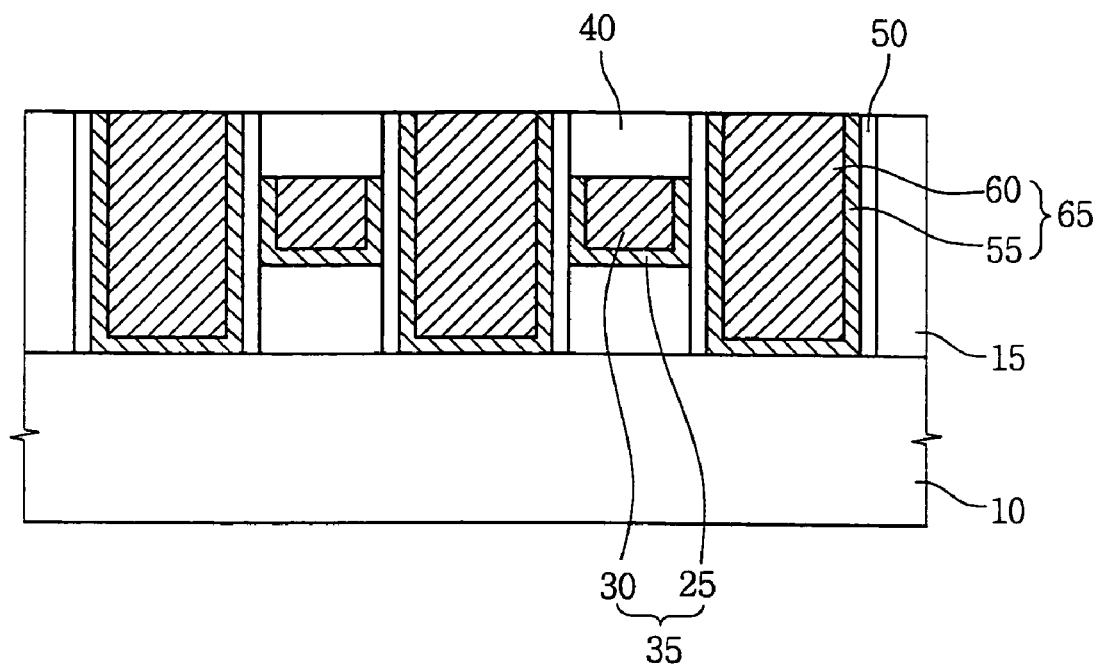
Figure 2A:
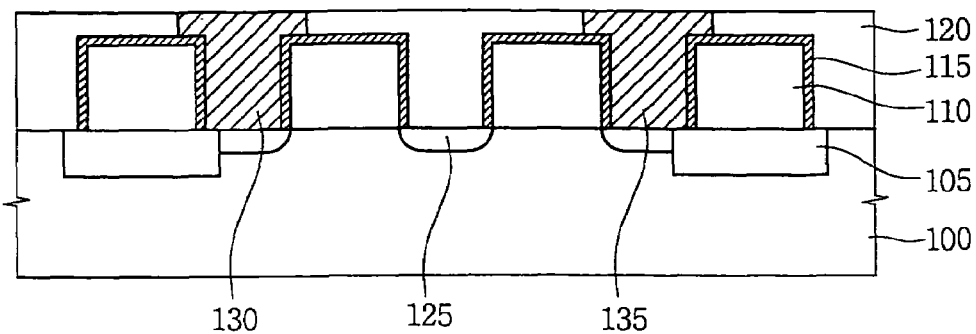
FIGS. 2A to 2E are cross-sectional views illustrating a conventional method for manufacturing a semiconductor device using a damascene process.
Figure 2B:
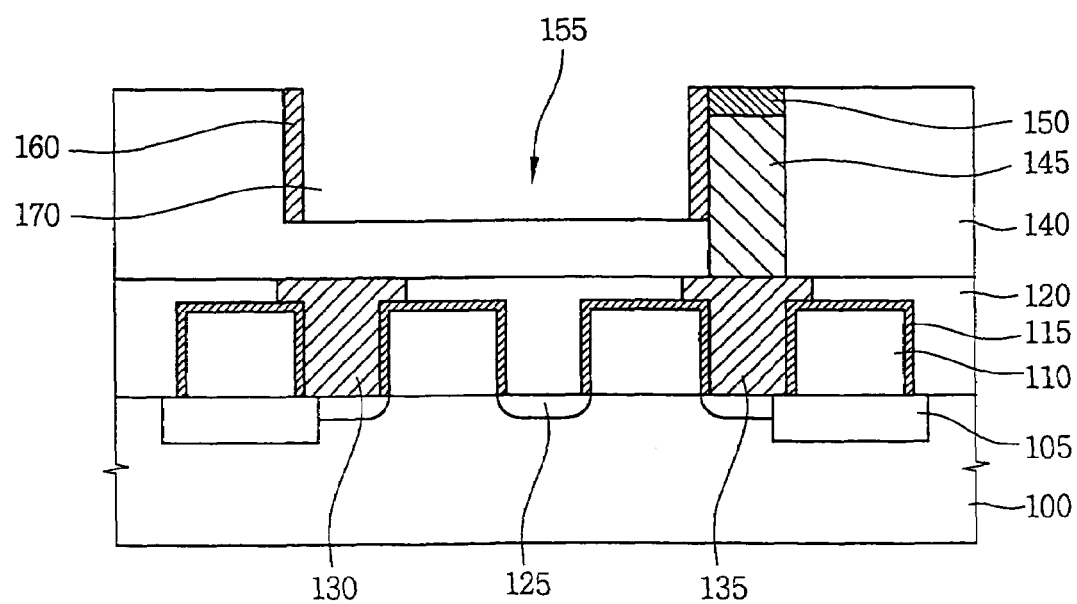
Figure 2C:
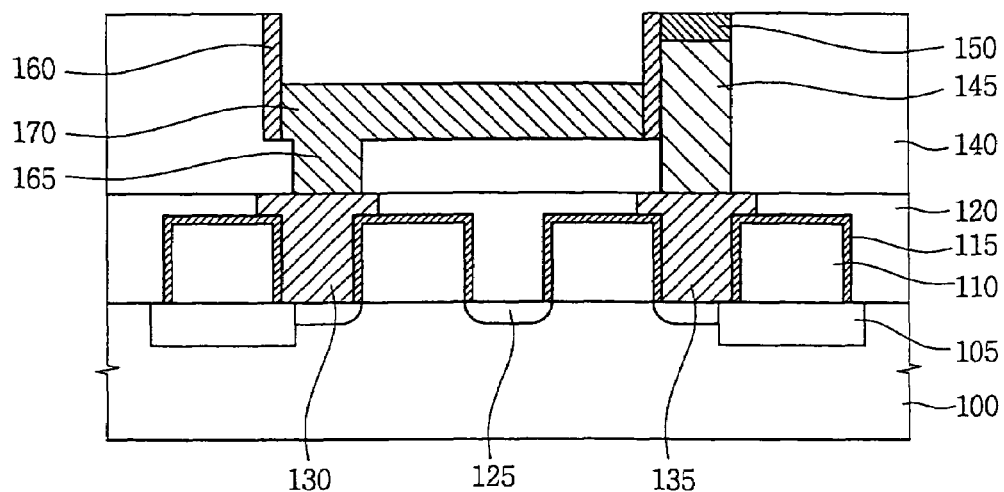
Figure 2D:
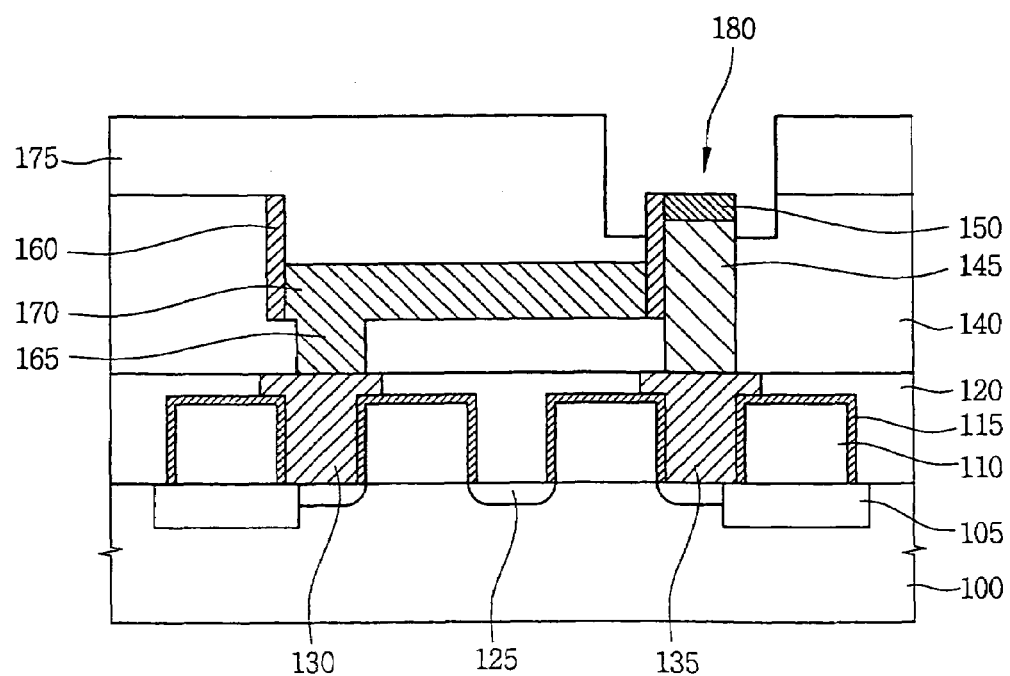
Figure 2E:
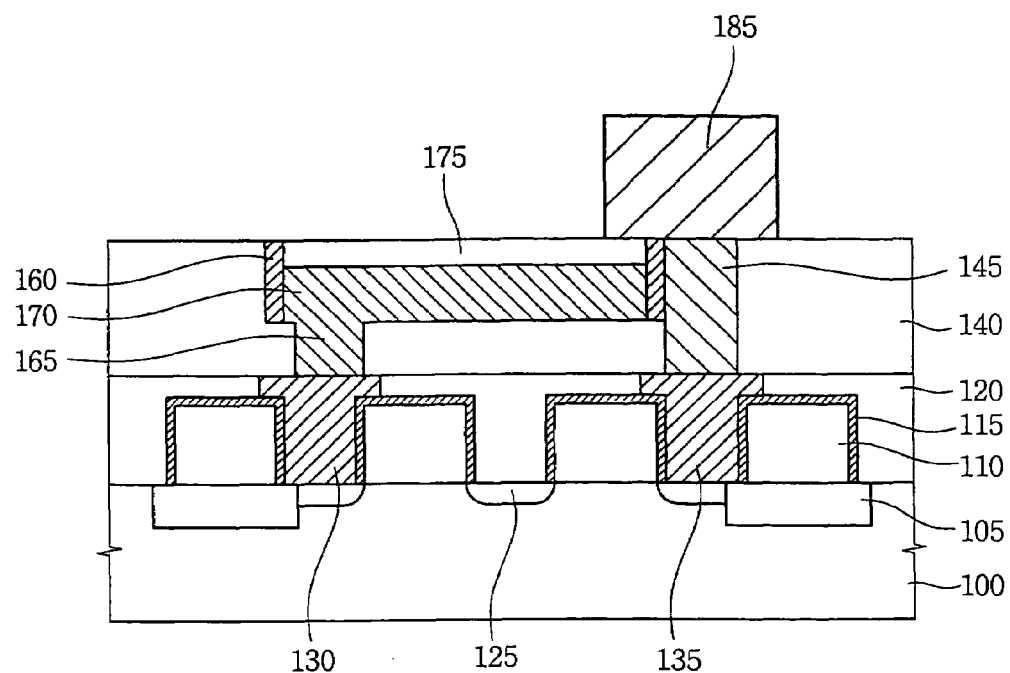

The present invention will now be described more fully with reference to the accompanying drawings, in which exemplary embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the size or thickness of layers and regions are exaggerated for clarity. Like numbers refer to like elements. It will be understood that when an element such as a layer, region or substrate is referred to as being "on" another element, it can be directly on the other element or intervening elements may also be present. In contrast, when an element is referred to as being "directly on" another element, there are no intervening elements present. As used herein the term "and/or" includes any and all combinations of one or more of the associated listed items.

FIGS. 3A to 3E are cross-sectional views illustrating exemplary operations for manufacturing a semiconductor device using a damascene process according to certain embodiments of the present invention.

Figure 3A:
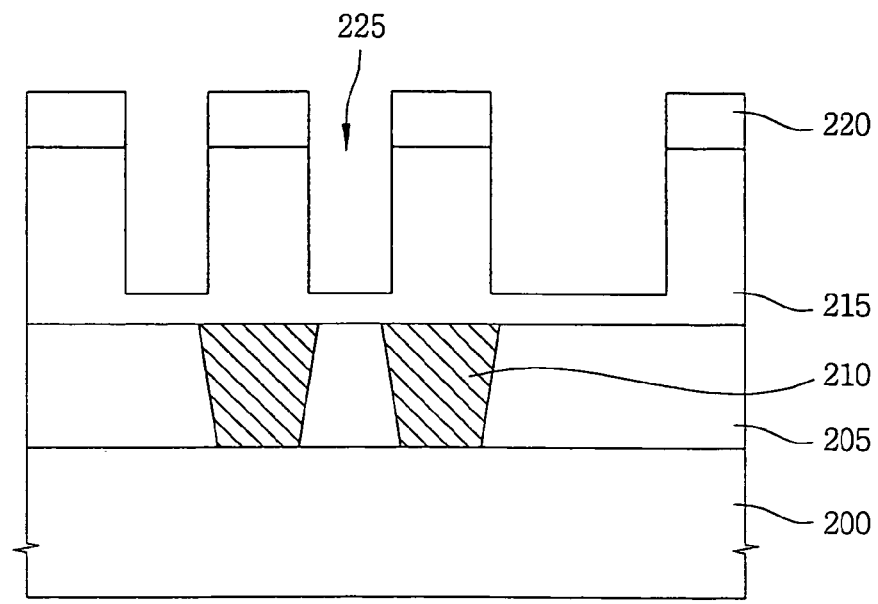
FIGS. 3A to 3E are cross-sectional views illustrating exemplary operations for forming a semiconductor device employing a damascene process according to some embodiments of the present invention.

Referring to FIG. 3A, a first insulation film 205 is formed on a semiconductor substrate 200 on which a transistor structure (not shown) is formed. A self-aligned contact (SAC) pad 210 is formed through the first insulation film 205. The first insulation film 205 may include silicon oxide, and the SAC pad 210 includes a metal, such a like titanium (Ti) or tungsten (W). Alternatively, the first insulation film 205 may include a material having a low dielectric constant, such as polysilazane (TOSZ), flowable oxide (FOW) or black diamond.

To form a bit line, a second insulation film 215 is formed on the first insulation film 205 having the SAC pad 210 formed therein. The second insulation film 215 may include silicon oxide formed using an atomic layer deposition (ALD) process, high density plasma (HDP) oxide, high temperature oxide (HTO), middle temperature oxide (MTO), tetraethyl ortho-silicate (TEOS) formed using a plasma enhanced chemical vapor deposition (PECVD) process, and/or silicon oxide formed using chemical vapor deposition (CVD) process. Alternatively, the second insulation film 215 may include a material having a low dielectric constant, such as TOSZ, FOX or black diamond. The second insulation film 215 may include the same material as the first insulation film 205. The second insulation film 215 has a height higher than that of conductive wiring 250 (see FIG. 3C) that will be formed therein.

After a first photoresist film (not shown) is formed on the second insulation film 215, the first photoresist film is patterned to form a first photoresist pattern 220 on the second insulation film 215. The insulation film 215 is partially etched using the first photoresist pattern 220 as an etching mask to form trenches or grooves 225 in the second insulation film 215. The first photoresist pattern 220 is removed using an ashing process and a stripping process.

Figure 3B:
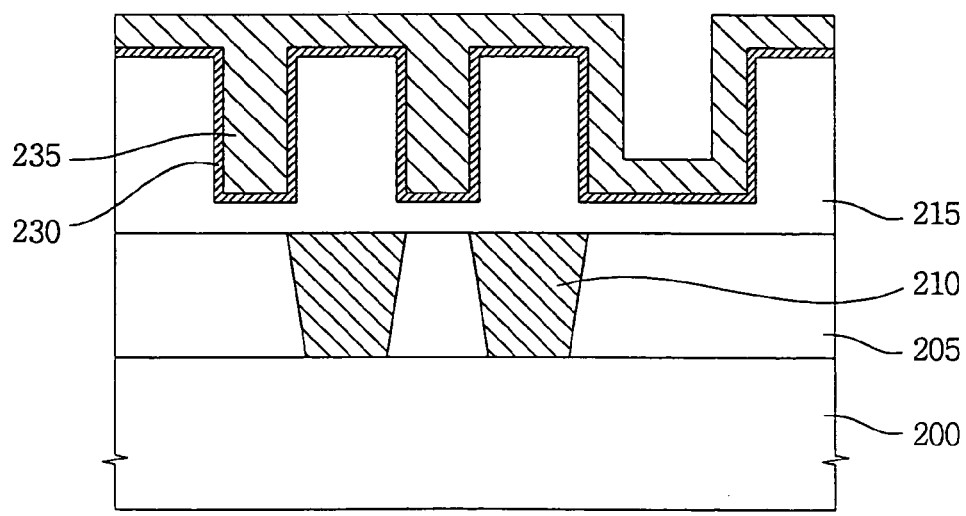

Referring to FIG. 3B, in some embodiments of the present invention, a glue layer 230 having a thickness of below about 300 Å is formed in the groove 225 and on the second insulation film 215 using a metal nitride or a non-metal nitride. The glue layer 230 may include, for example, titanium nitride (TiN), tantalum nitride (TaN) and/or boron nitride (BN). The glue layer 230 is formed on sidewalls of the groove 225 and on a bottom of the groove 225. The glue layer 230 enhances an adhesiveness of a subsequently formed first conductive film 235 to the second insulation film 215, thereby preventing the first conductive film 235 from being separated from the second insulation film 215.

The first conductive film 235 may be formed on the glue layer 230 using a sputtering process, a vacuum evaporation process or a CVD process. The first conductive film 235 may include tungsten, tantalum nitride, titanium nitride, aluminum (Al), nickel (Ni) and/or cobalt (Co). The first conductive film 235 is formed on the glue layer 230, filling the groove 225.

In some embodiments, the first conductive film 235 is directly formed on the second insulation film 215 using tungsten, aluminum, nickel and/or cobalt formed by a physical vapor deposition (PVD) process without a formation of an intervening glue layer. That is, the glue layer 230 may be omitted if the first conductive film 235 has adequate adhesion strength relative to the second insulation film 215.

Figure 3C:
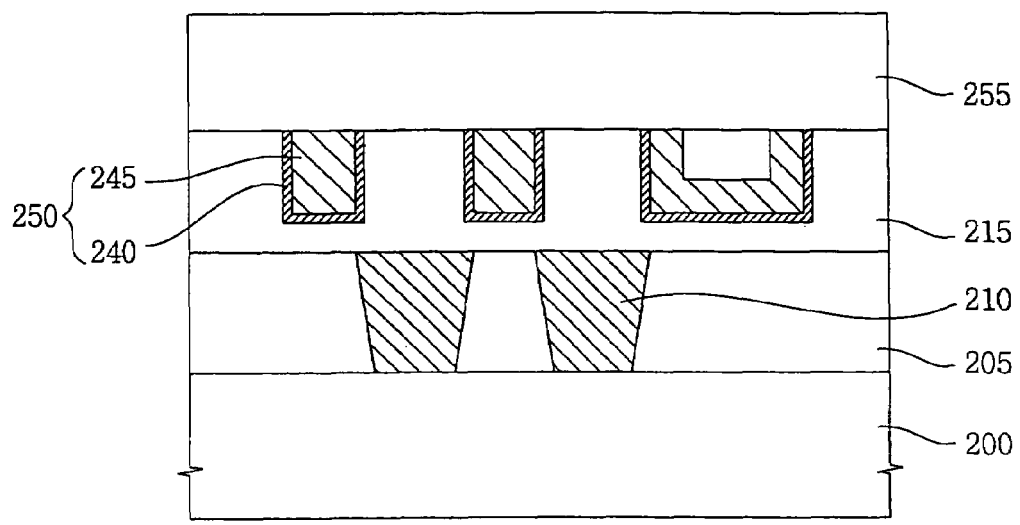

Referring to FIG. 3C, the first conductive film 235, the glue layer 230 and the second insulation film 215 are etched using a damascene process including a chemical-mechanical polishing (CMP) or an etch back planarization technique. When the first conductive film 235 and the glue layer 230 on the second insulation film 215 are etched to respectively form first conductive patterns 245 and glue layer patterns 240 in the grooves 225 by the damascene process, conductive wiring 250 including the first conductive patterns 245 and the glue layer patterns 240 is formed in the grooves 225. Each line of the conductive wiring 250 corresponds to a bit line of the semiconductor device.

A third insulation film 255 is formed on the conductive wiring 250 and on the second insulation film 215. The third insulation film 255 may include an oxide, such as silicon oxide formed by an ALD process, HTO, MTO, TEOS formed by a PECVD process, and/or silicon oxide formed by a thermal oxidation process or a CVD process. Alternatively, the third insulation film 255 may include a material having a low dielectric constant such as TOSZ, FOX or black diamond. According to certain embodiments of the present embodiment, the first, second and third insulation films 205, 215 and 255 may be formed using the same materials. Additionally, the above-mentioned materials having low dielectric constants can be employed for other insulation films of the semiconductor device.

Figure 3D:
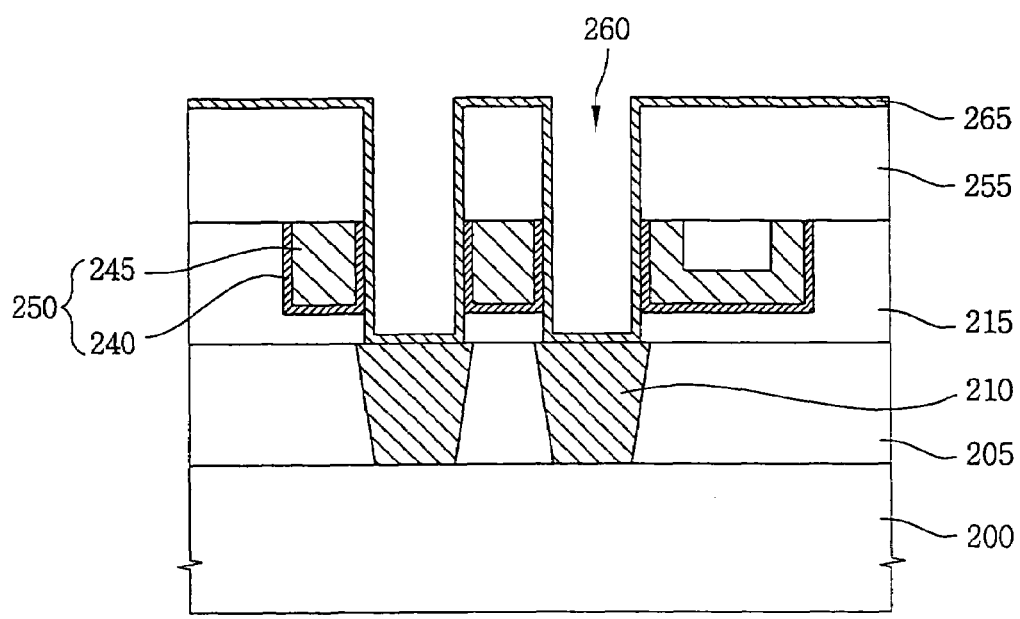

Referring to FIG. 3D, after a second photoresist film (not shown) is formed on the third insulation film 255, the second photoresist film is patterned to form a second photoresist pattern (not shown) on the third insulation film 255. To form a contact plug 280 of a capacitor, the third and second insulation films 255 and 215 are partially etched using the second photoresist pattern as an etching mask. A contact hole 260 is formed through the third and second insulation films 255 and 215 to expose the SAC pad 210 in the first insulation film 205. The contact hole 260 is positioned between the lines of the conductive wiring 250 formed in the second insulation film 215.

The contact hole 260 can be formed with little or no damage to the first conductive patterns 245 because the first conductive patterns 245 have an etching selectivity relative to the third and second insulation films 255 and 215. For example, when the first conductive patterns 245 include tungsten and the third and second insulation films 255 and 215 include oxides, the third and second insulation films 255 and 215 can be etched to form the contact hole 260 exposing the SAC pad 210 with little or no damage to the first conductive pattern 245 because an etching selectivity between the tungsten and the oxide is more than about 1:20. An isolation film 265 having a thickness of about 50 Å to about 600 Å is formed on the third insulation film 255. The isolation film 265 may include silicon nitride or silicon oxide such as HTO or MTO. The isolation film 265 may be formed using an ALD process, a low pressure CVD (LPCVD) process, a thermal oxidation process and/or a PECVD process.

Figure 3E:
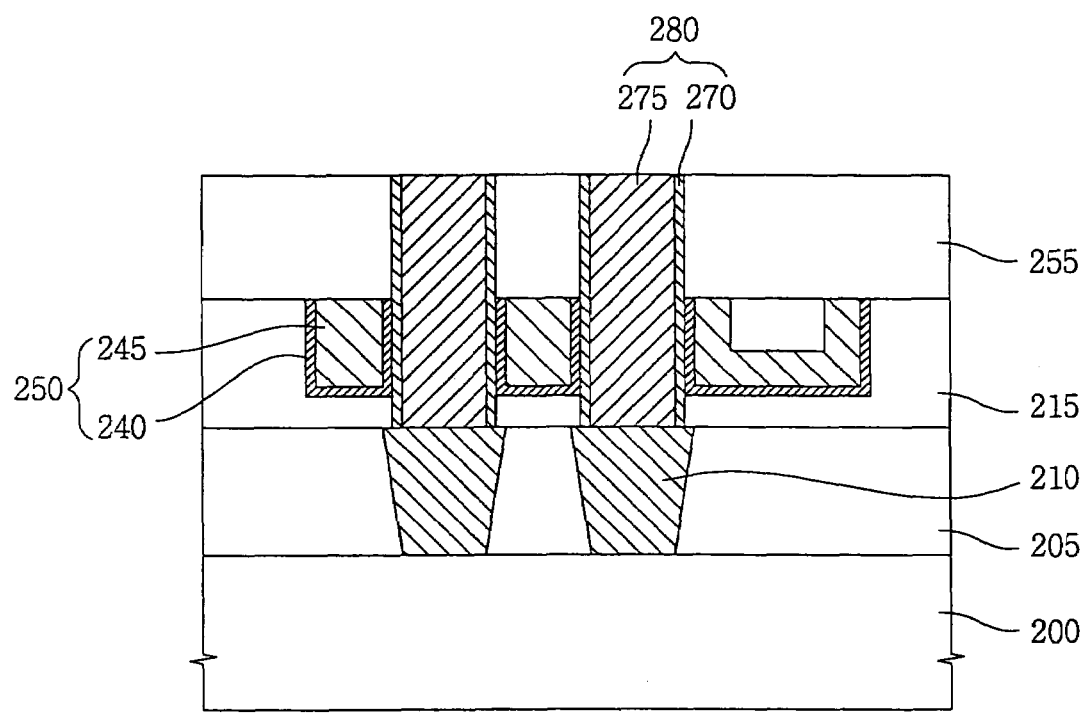

Referring to FIG. 3E, portions of the isolation film 265 on the third insulation film 255 and on the bottom on the contact hole 260 are removed using a photolithography process to form an isolation film pattern 270 on sidewalls of the contact hole 260. The isolation film pattern 270 electrically insulates the conductive wiring 250 from a second conductive pattern 275 successively formed in the contact hole 260.

A second conductive film (not shown) is formed on the third insulation film 255 to fill up the contact hole 260. The second conductive film may include tungsten, titanium nitride, tantalum nitride or polysilicon. The second conductive film may be etched using a CMP process or an etch-back process in order to form a second conductive pattern 275 in the contact hole 260. Thus, a contact plug 280 including the isolation film pattern 270 and the second conductive pattern 275 is formed in the contact hole 260. A bottom electrode, a dielectric layer and a plate electrode are then successively formed on the contact plug 280, thereby forming the capacitor electrically connected to the SAC pad 210 through the contact plug 280.

Figure 4:
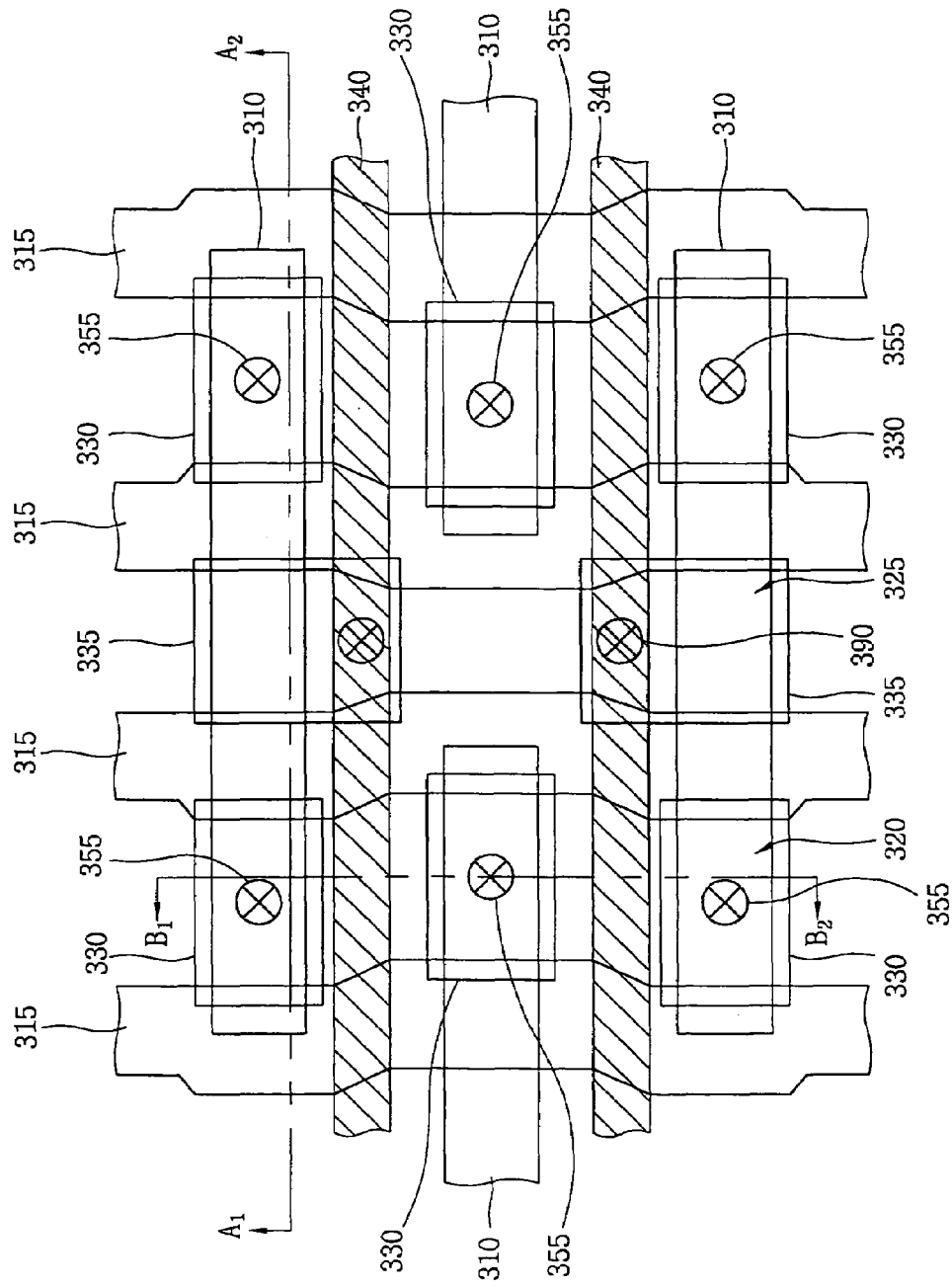
FIG. 4 is a plan view illustrating a semiconductor device manufactured according to further embodiments of the present invention.
Figure 5:
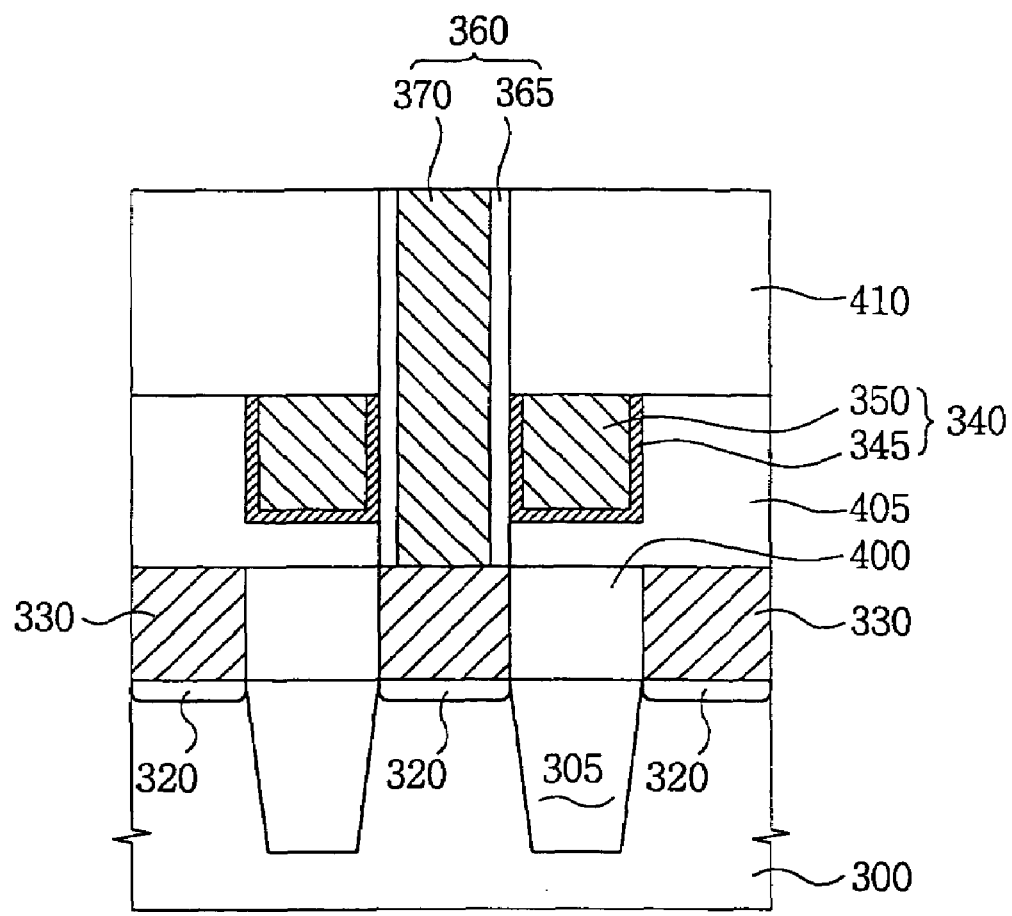
FIG. 5 is a cross-sectional view illustrating the semiconductor device of FIG. 4.

FIG. 4 is a plan view illustrating a semiconductor device manufactured employing a damascene process according to another embodiment of the present invention, while FIG. 5 is a cross-sectional view illustrating the semiconductor device of FIG. 4 taken along a line B1-B2 centered around a bit line of the semiconductor device. Though a DRAM device is shown in FIGS. 4 and 5, the present invention is not limited to DRAM devices.

Referring to FIGS. 4 and 5, metal oxide semiconductor (MOS) transistors are formed on a semiconductor substrate 300 wherein an active region 310 is defined by an isolation film 305. The MOS transistors have gate structures 315 corresponding to word lines of a semiconductor device, source regions 320 meeting contact regions of capacitors, and drain regions 325 contacting the bit lines 340 of the semiconductor device. First pads 330 and second pads 335 are formed respective ones of the source and drain regions 320 and 325 between the gate structures 315 of the MOS transistor. The capacitors and the bit lines 340 electrically contact with the first pads 330 and the second pads 335, respectively.

The bit lines 340 are formed over the semiconductor substrate 300 on which the MOS transistors are positioned. Each of the bit lines 340 includes a glue layer pattern 345 and a first conductive pattern 350. As described above, the glue layer pattern 345 may be omitted when the first conductive pattern 350 is formed using a PVD process.

Storage node contact holes 355 are formed between the bit lines 340. The storage node contact holes 355 expose the first pads 330 contacting the source regions 320. A storage node contact 360 is formed in each storage node contact hole 355. The storage node contact 360 includes an isolation film pattern 365 and a second conductive pattern 370. The isolation film pattern 365 is formed on sidewalls of the storage node contact hole 355, and the second conductive pattern 370 fills up the storage node contact hole 355. In the illustrated embodiments, the storage node contact 360 has a shape of a contact plug or a shape of a storage electrode pattern formed using a photolithography process.

FIGS. 6A to 9D are cross-sectional views illustrating exemplary operations for forming a semiconductor device of FIG. 4 according to further embodiments of the present invention. In particular, FIGS. 6A, 7A, 8A and 9A are cross-sectional views taken along a line of $A_1$-$A_2$ in FIG. 4, and FIGS. 6B, 7B, 8B and 9B are cross-sectional views taken along the line of $B_1$-$B_2$ in FIG. 4. In FIGS. 6A to 9B, like reference numerals identify similar or identical elements in FIGS. 4 and 5.

Figure 6A:
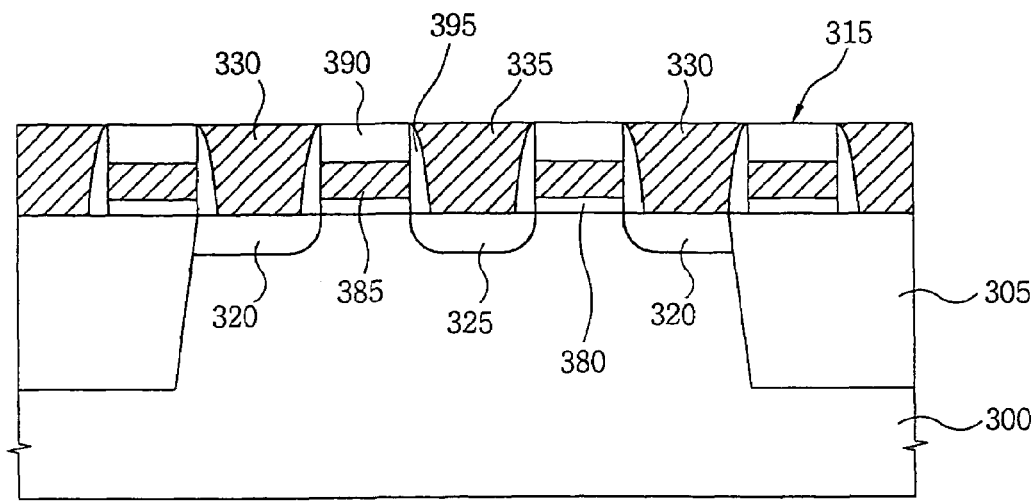
FIGS. 6A through 9B are cross-sectional views illustrating exemplary operations for forming a semiconductor device according still further embodiments of the present invention.
Figure 6B:
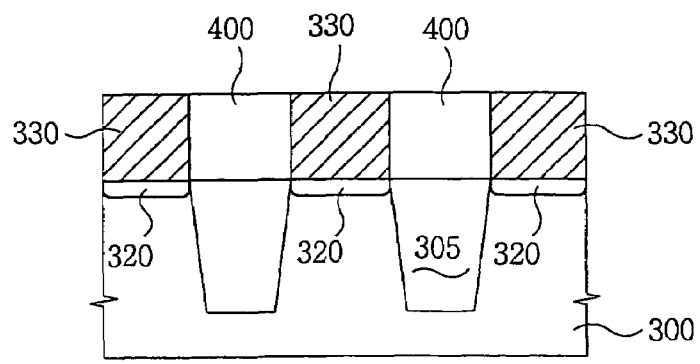

FIGS. 6A and 6B are cross-sectional views illustrating operations for forming a first pad and a second pad on a semiconductor substrate.

Referring to FIGS. 6A and 6B, an isolation film 305 is formed on a semiconductor substrate 300 using an isolation process, such as a shallow trench isolation process, to define an active region 310 (FIG. 4) on the semiconductor substrate 300.

Thin gate oxide films 380 are formed in the active region 310 using a thermal oxidation process. Gate electrodes 385 are then formed on the respective gate oxide films 380. The gate electrodes 385 correspond to word lines of a semiconductor device. The gate electrodes 385 may be formed using a diffusion process or an in-situ doping process, thereby having polycide structures including polysilicon films highly doped with impurities and tungsten silicide films.

Silicon nitride capping layers 390 are then formed on the gate electrodes 385, and spacers 395 are formed on sidewalls of the gate electrodes 385. Gate structures 315 include the gate oxide films 380, the gate electrodes 385, the capping layers 390 and the spacers 395.

Impurities are implanted into surface portions of the substrate 300 using the gate structures 315 as masks to form source and drain regions 320 and 325 in the active region 310 of the substrate 300. As a result, MOS transistors including the gate structures 315 and the source/drain regions 320 and 325 are formed on the semiconductor substrate 300. Some of the source/drain regions 320 and 325 contact regions of capacitors while others of the source/drain regions 320 and 325 contact bit lines of the semiconductor device. For example, the source regions 320 correspond to storage node contact regions, and the drain regions 325 correspond to bit line contact regions.

After a first insulation film 400 is formed on the substrate 300 including the MOS transistors formed thereon, the first insulation film 400 is planarized using a CMP process. The first insulation film 400 may include an oxide or a material having a low dielectric constant such as TOSZ, FOX or black diamond. The oxide may include borophosphosilicate glass (BPSG), un-doped silicate glass (USG) and/or spin on glass (SOG). When the first insulation film 400 is planarized, the capping layer 390 is used as a stopper during the CMP process.

The first insulation film 400 is etched to form contact holes (not shown) through the first insulation film 400 between the gate structures 315. For example, when the first insulation film 400 includes oxide and the capping layer 390 includes nitride, the etching process for the first insulation film 400 is performed with a high etching selectivity between the first insulation film 400 and the capping layer 390 so that the contact holes are formed by a self-aligned process with respect to the gate structures 315. When the contact holes are formed through the first insulation film 400, the source and drain regions 320 and 325 of the MOS transistors are partially exposed.

After a polysilicon film highly doped with impurities is formed on the first insulation film 400 and on the capping layer 390 to fill up the contact holes, the polysilicon film is etched until the capping layer 390 is exposed. Thus, a first pad 330 and a second pad 335 are formed in the contact holes. The first and second pads 330 and 335 are electrically connected to the source and drain regions 320 and 325, respectively.

Figure 7A:
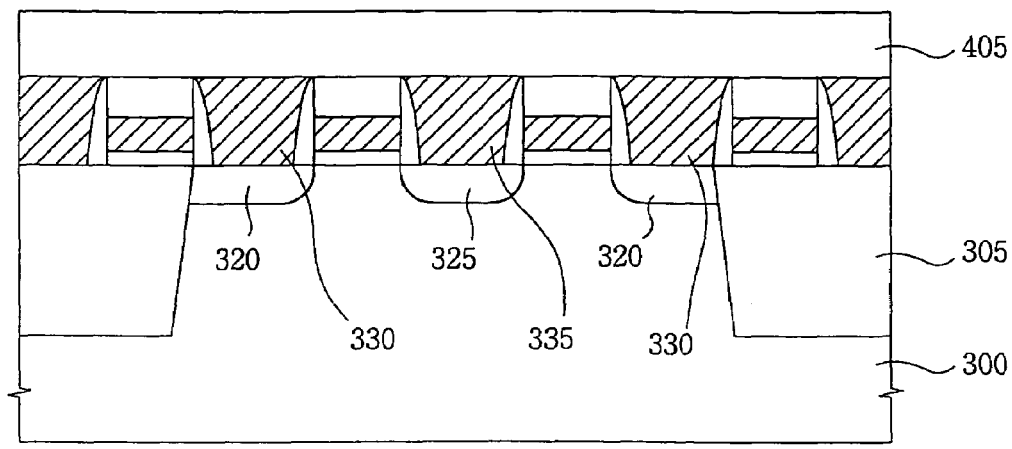
Figure 7B:
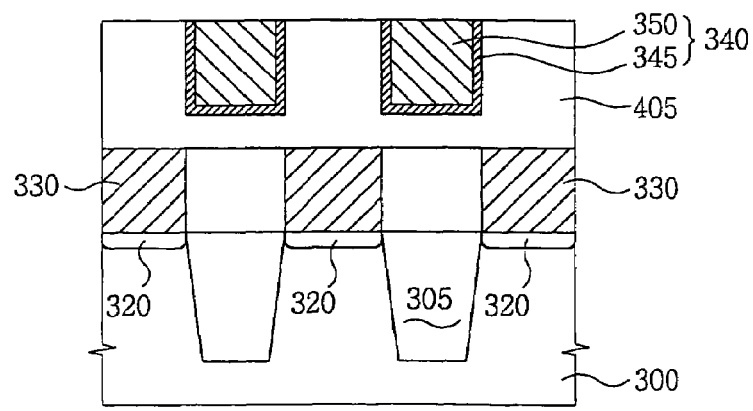

FIGS. 7A and 7B are cross-sectional views illustrating exemplary operations for forming a second insulation film and bit lines.

Referring to FIGS. 7A and 7B, a second insulation film 405 is formed over the semiconductor substrate 300 including the MOS transistors and the first and second pads 330 and 335. The second insulation film 405 may include an oxide formed using an ALD process, an HDP oxide, HTO, MTO, TEOS formed by a PECVD process, and/or a silicon oxide formed by a CVD process. Alternatively, the second insulation film 405 may include a material having a low dielectric constant, such as TOSZ, FOX or black diamond. The second insulation film 405 has a height greater than that of bit lines 340 subsequently formed therein.

To form the bit lines 340, portions of the second insulation film 405 are etched using a photolithography process to form grooves or trenches (not shown) in the second insulation film 405. The first insulation film 400 is also partially etched to form bit line contact holes (not shown) that expose the second pads 335 positioned below the trenches of the second insulation film 405. A glue layer (not shown) is formed on sidewalls and bottoms of the trenches of the second insulation film 405 and on sidewalls and bottoms of the bit line contact holes. The glue layer may include titanium nitride, tantalum nitride or boron nitride, and preferably has a thickness less than about 300 Å. The glue layer can improve an adhesiveness of a first conductive film (not shown) relative to the second and first insulation films 405 and 400 so that the first conductive film for the bit line 340 will not separate from the second and first insulation films 405 and 400.

The first conductive film for the bit lines 340 may be formed on the glue layer positioned in the bit line contact holes and in the trenches of the second insulation film 405 using a sputtering process, a vacuum evaporation process, a PVD process or a CVD process. The first conductive film may include tungsten, tantalum nitride, titanium nitride, aluminum, nickel or cobalt. The first conductive film is formed on the second insulation film 405 so as to fill up the bit line contact holes and the trenches in the second insulation film 405. As described above, the glue layer may be omitted if the first conductive film has sufficient adhesion strength relative to the first and second insulation films 400 and 405, e.g., when the first conductive film is formed using a PVD process.

When the first conductive film, the glue layer and the second insulation film 405 are etched using a CMP or an etch back planarization technique, bit line contacts (not shown) are formed in the bit line contact holes and bit lines 340 are formed in the trenches in the second insulation film 405. The bit lines 340 include glue layer patterns 345 and first conductive patterns 350.

Figure 8A:
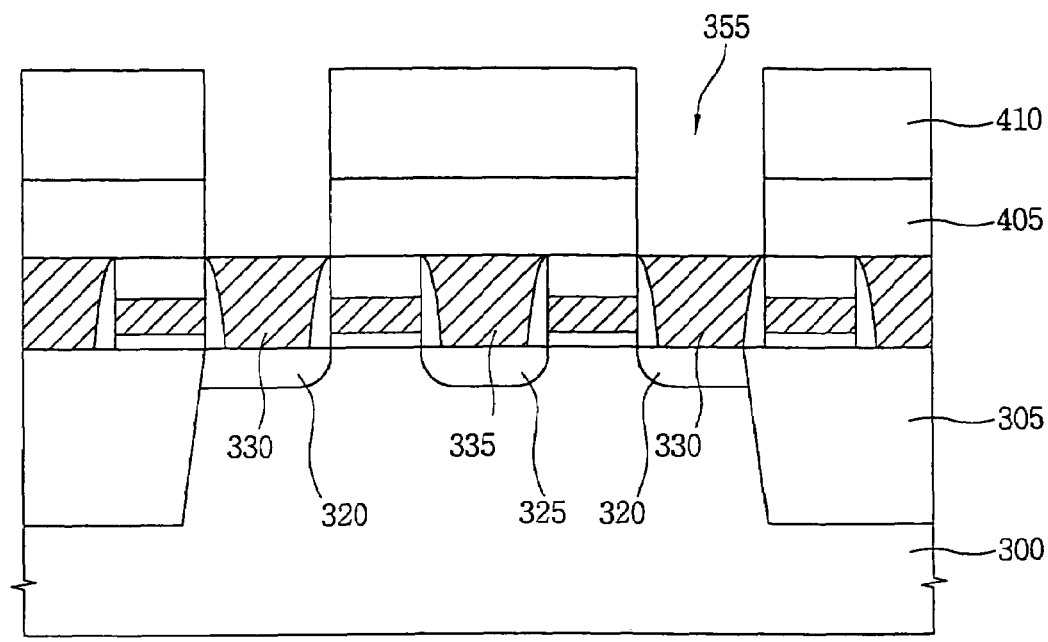
Figure 8B:
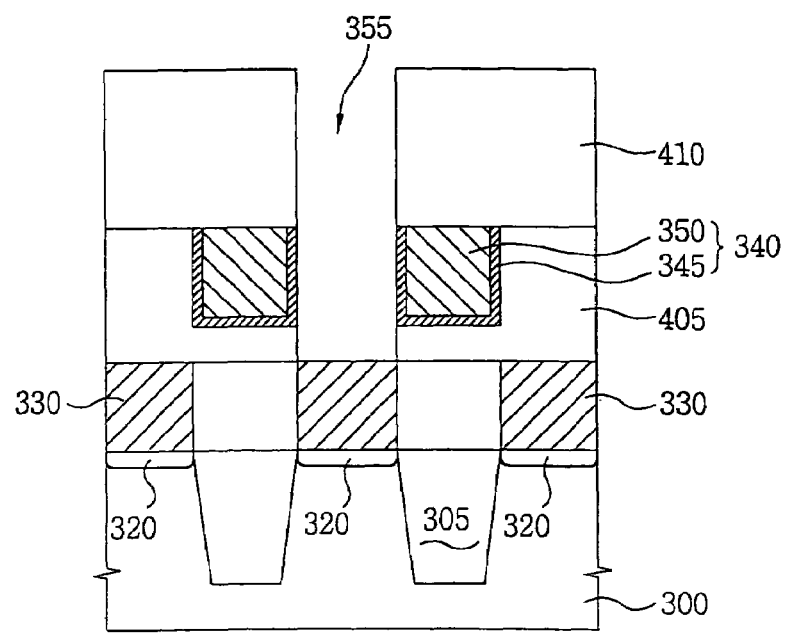

FIGS. 8A and 8B are cross-sectional views illustrating exemplary operations for forming a third insulation film and storage node contact holes.

Referring to FIGS. 8A and 8B, a third insulation film 410 is formed on the bit lines 340 and on the second insulation film 405. The third insulation film 410 may include an oxide formed using an ALD process, an HDP oxide, HTO, MTO, TEOS formed by a PECVD process, or a silicon oxide formed by a CVD process. Alternatively, the third insulation film 410 may include a material having a low dielectric constant, such as TOSZ, FOX or black diamond.

The third and second insulation films 410 and 405 are partially etched using a self-alignment process with respect to the bit lines 340 to form storage node contact holes 355 through the third and second insulation films 410 and 405. The storage node contact holes 355 expose the first pads 330. The storage node contact holes 355 extend below the bit lines 340 formed on the second insulation film 405. Though the first conductive patterns 350 are exposed during formations of the storage node contact holes 355, the storage node contact holes 355 are formed without significant damage to the first conductive patterns 350 because each first conductive pattern 350 has an etching selectivity relative to the second and third insulation films 405 and 410. For example, when the first conductive pattern 350 includes tungsten and the second and third insulation films 405 and 410 include oxides, the first conductive pattern 350 may not be significantly damaged during the formation of the storage node contact hole 355 because the etching selectivity between the first conductive pattern 350 and the insulation films 405 and 410 is no less than about 1:20.

Figure 9A:
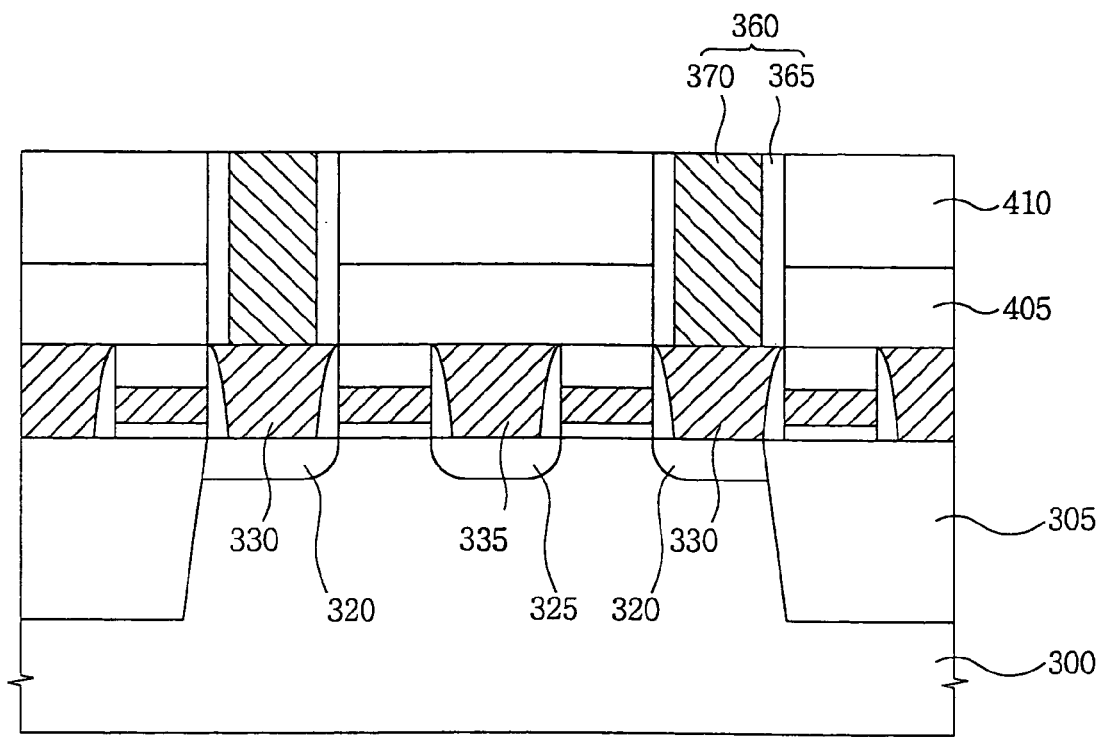
Figure 9B:
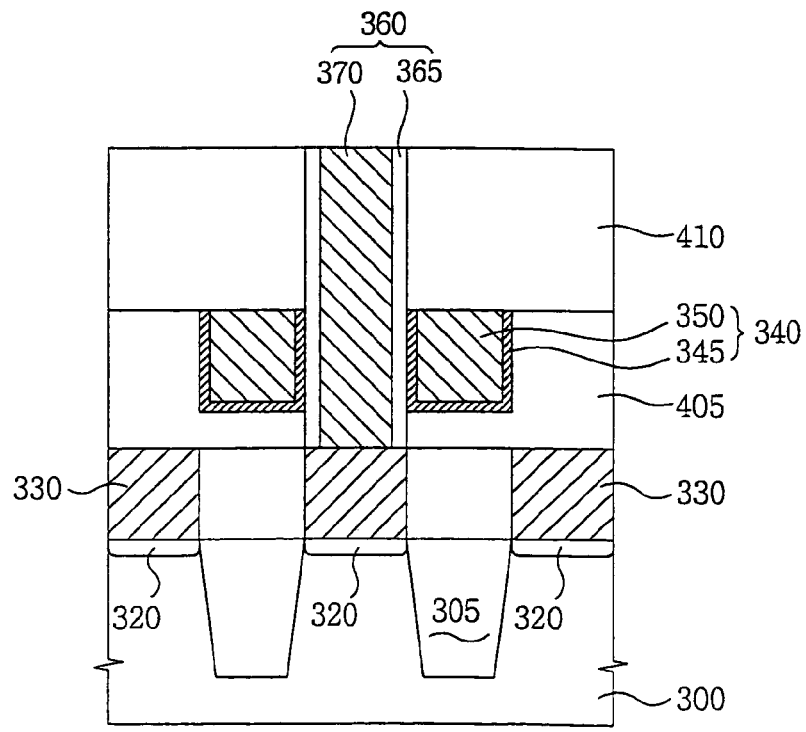

FIGS. 9A and 9B are cross-sectional views illustrating exemplary operations for forming storage node contacts in the storage node contact holes.

Referring to FIGS. 9A and 9B, an isolation film (not shown) is formed on the third insulation film 410, filling the storage node contact holes 355, using an ALD process, an LPCVD process, a thermal oxidation process or a PECVD process. The isolation film preferably has a thickness of about 50 to 600 Å and includes silicon nitride or silicon oxide like HTO or MTO. Portions of the isolation film on the third insulation film 410 and on bottoms of the storage node contact holes 355 are removed using a photolithography proves, thereby forming isolation film patterns 365 on sidewalls of the storage node contact holes 355. The isolation film patterns 365 electrically insulate the bit lines 340 from a second conductive pattern 370 formed in the storage node contact hole 355.

A second conductive film (not shown) is formed on the third insulation film 410, filling the storage node contact holes 355. The second conductive film may include tungsten, titanium nitride, tantalum nitride or polysilicon. The second conductive film is polished using a CMP process or an etch back process to form second conductive patterns 370 in the storage node contact hole 355s, thereby forming storage node contacts 360, each including an isolation film pattern 365 and a second conductive pattern 370 in the storage node contact hole 355. A bottom electrode, a dielectric layer and a plate electrode are successively formed on the storage node contacts 360 to form capacitors electrically connected to the first pads 330.

According to certain embodiments of the present invention, conductive wiring, such as a bit line, is formed using a damascene process without an additional hard mask. Generation of metal polymers caused by an etching process may be avoided, such that the likelihood of failure of the semiconductor device can be reduced. In addition, manufacturing can be simplified and manufacturing yield can be improved because processes for forming and etching a hard mask can be eliminated. Also, a capacitor contact hole can be formed between bit lines with a sufficient processing margin employing a self-aligned process with respect to bit lines because the bit lines are formed on an insulation film using the damascene process. Therefore, the likelihood of failure of the semiconductor device caused by a resistance augmentation between a storage node contact and a pad without a reduction of a design rule for the semiconductor device can be reduced. Furthermore, because an isolation film pattern can be positioned between the conductive wiring and a contact plug, parasitic capacitance between the conductive wiring and the contact plug can be greatly reduced and formation of electrical shorts between the conductive wiring and the contact plugs can be prevented. As a result, a reliability of the semiconductor device can be improved.

In the drawings and specification, there have been disclosed exemplary embodiments of the invention and, although specific terms are employed, they are used in a generic and descriptive sense only and not for purposes of limitation, the scope of the invention being set forth in the following claims.

That which is claimed is:

1. A method of fabricating an integrated circuit device, the method comprising:
    forming a first insulation layer on a substrate;
    forming a contact pad in the first insulation layer in direct contact with the substrate;
    forming a second insulation layer on the first insulation layer;
    forming a conductive pattern in the second insulation layer;
    forming a contact hole through the second insulation layer that exposes the contact pad and a sidewall of the conductive pattern;
    forming an insulation film on the exposed sidewall of the conductive pattern and on an adjacent sidewall of the second insulation layer in the contact hole; and
    forming a conductive plug in the contact hole abutting the insulation film and in contact with the contact pad.

2. The method according to claim 1, wherein the second insulation layer comprises an oxide, and wherein the conductive pattern comprises tungsten.

3. The method according to claim 1, wherein the insulation film comprises silicon oxide and/or silicon nitride.

4. The method according to claim 3, wherein the insulation film has a thickness of about 50 Å to about 600 Å.

5. The method according to claim 1, further comprising forming a third insulation layer on the second insulation layer and the conductive pattern, and wherein forming a conductive plug in the contact hole abutting the insulation film and in contact with the contact pad comprises forming a conductive plug that extends through the second and third insulation layers.

6. The method according to claim 5:
    wherein the first insulation layer comprises a silicon oxide, a high density plasma oxide, a high temperature oxide, a middle temperature oxide, a tetraethyl ortho-silicate, a polysilazane, a flowable oxide and/or a black diamond material; and
    wherein the second insulation layer comprises a silicon oxide, a high density plasma oxide, a high temperature oxide, a middle temperature oxide, a tetraethyl ortho-silicate, a polysilazane, a flowable oxide and/or a black diamond material; and
    wherein the third insulation layer comprises a silicon oxide, a high density plasma oxide, a tetraethyl ortho-silicate, a middle temperature oxide and/or a high temperature oxide, a polysilazane, a flowable oxide and/or a black diamond material.

7. The method according to claim 5, wherein forming a conductive plug that extends through the second and third insulation layers comprises:
    etching the second and third insulation layers to form a contact hole that exposes the contact pad and a sidewall of the conductive pattern;
    forming an insulation film lining the contact hole;
    removing a portion of the insulation film on the contact pad to expose the contact pad; and
    forming the conductive plug in the contact hole on the exposed contact pad.

8. The method according to claim 7, wherein forming the conductive plug in the contact hole comprises:
    depositing a conductive material on the substrate, filling the contact hole; and
    planarizing the substrate to form the conductive plug.

9. The method according to claim 1, wherein forming a conductive pattern comprises:
    forming a trench in the second insulation layer;
    depositing a conductive material on the substrate and in the trench; and
    planarizing the substrate to form the conductive pattern in the second insulation layer.

10. The method according to claim 9, wherein depositing a conductive material is preceded by forming a glue layer in the trench.

11. The method according to claim 10, wherein the glue layer comprises titanium nitride, tantalum nitride or boron nitride.

12. The method according to claim 10, wherein the glue layer has a thickness less than about 300 Å.

13. The method according to claim 1, wherein the conductive pattern comprises tungsten, tantalum nitride, titanium nitride, cobalt, nickel and/or aluminum.

14. The method according to claim 1:
    wherein the conductive pattern comprises tungsten, tantalum nitride, aluminum, nickel, or cobalt; and
    wherein the conductive plug comprises tungsten, titanium nitride, tantalum nitride and/or polysilicon.

15. A method of fabricating an integrated circuit memory device, the method comprising:
    forming a source/drain region in a substrate;
    forming a first insulation layer on the substrate;
    forming a storage node contact pad in the first insulation layer and in contact with the source/drain region;
    forming a second insulation layer on the first insulation layer;
    forming first and second damascene bit lines in respective trenches in the second insulation layer on opposite sides of the storage node contact pad;
    forming a conductive plug extending through the second insulation layer between the first and second damascene bit lines to contact the storage node contact pad, the conductive plug self-aligned to the first and second bit lines; and
    forming a capacitor on the conductive plug.

16. The method according to claim 15, wherein forming a conductive plug is preceded by forming a third insulation layer on the second insulation layer and the first and second bit lines, wherein forming a conductive plug comprise forming a conductive plug that extends through the second and third insulation layer, and wherein forming a capacitor comprises forming the capacitor on the third insulation layer.

17. The method according to claim 16, wherein forming a conductive plug that extends through the second and third insulation layer comprises:
   etching the second and third insulation layers to form a contact hole that exposes the storage node contact pad and sidewalls of the first and second bit lines;
   forming an insulation film lining the contact hole;
   removing a portion of the insulation film on the storage node contact pad to expose the storage node contact pad; and
   forming the conductive plug in the contact hole on the exposed storage node contact pad.

18. The method according to claim 17, wherein forming the conductive plug in the contact hole comprises:
   depositing a conductive material on the substrate, filling the contact hole; and
   planarizing the substrate to form the conductive plug.

19. The method according to claim 16:
   wherein the first insulation layer comprises a silicon oxide, a high density plasma oxide, a high temperature oxide, a middle temperature oxide, a tetraethyl ortho-silicate, a polysilazane, a flowable oxide and/or a black diamond material;
   wherein the second insulation layer comprises a silicon oxide, a high density plasma oxide, a high temperature oxide, a middle temperature oxide, a tetraethyl ortho-silicate, a polysilazane, a flowable oxide and/or a black diamond material; and
   wherein the third insulation layer comprises a silicon oxide, a high density plasma oxide, a tetraethyl ortho-silicate, a middle temperature oxide and/or a high temperature oxide, a polysilazane, a flowable oxide and/or a black diamond material.

20. The method according to claim 15, wherein the second insulation layer comprises an oxide, and wherein the first and second bit lines each comprise tungsten.

21. The method according to claim 15, wherein forming a conductive plug is preceded by forming an insulation film on sidewalls of the first and second bit lines.

22. The method according to claim 15, wherein forming first and second bit lines is preceded by forming respective glue layers in respective ones of the trenches.

23. The method according to claim 22, wherein the glue layers each comprise titanium nitride, tantalum nitride or boron nitride.

24. The method according to claim 15, wherein the first and second bit lines each comprise tungsten, tantalum nitride, titanium nitride, cobalt, nickel and/or aluminum.

25. The method according to claim 15:
   wherein the first and second bit lines each comprise tungsten, tantalum nitride, aluminum, nickel, or cobalt; and
   wherein the conductive plug comprises tungsten, titanium nitride, tantalum nitride and/or polysilicon.

26. A method of fabricating an integrated circuit device, the method comprising:
   forming a first insulation layer on a substrate;
   forming a contact pad in the first insulation layer in direct contact with the substrate;
   forming a second insulation layer on the first insulation layer;
   forming a plurality of conductive patterns in the second insulation layer;
   forming a plurality of self-aligned contact holes between the conductive patterns and through the second insulation layer, the self-aligned contact holes exposing the contact pad and a sidewall of the conductive pattern; and
   forming a conductive plug in the contact holes, the conductive plug extending through the second insulation layer to contact the contact pad and being self-aligned to the conductive patterns.

27. The method of according to claim 26, wherein the second insulation layer comprises an oxide, and wherein the conductive pattern comprises tungsten.

28. The method of according to claim 26, wherein the insulation film comprises silicon oxide and/or silicon nitride.

29. The method of according to claim 26, further comprising forming a third insulation layer on the second insulation layer and the conductive pattern, wherein forming the conductive plug in the contact holes comprises forming the conductive plug that extends through the second and third insulation layers.

30. The method of according to claim 29, wherein the first insulation layer comprises a silicon oxide, a high density plasma oxide, a high temperature oxide, a middle temperature oxide, a tetraethyl ortho-silicate, a polysilazane, a flowable oxide and/or a black diamond material; and
   wherein the second insulation layer comprises a silicon oxide, a high density plasma oxide, a high temperature oxide, a middle temperature oxide, a tetracthyl ortho-silicate, a polysilazane, a flowable oxide and/or a black diamond material; and
   wherein the third insulation layer comprises a silicon oxide, a high density plasma oxide, a tetraethyl ortho-silicate, a middle temperature oxide and/or a high temperature oxide, a polysilazane, a flowable oxide and/or a black diamond material.

31. The method of according to claim 29, wherein forming the conductive plug comprises:
   etching the second and third insulation layers to form a contact hole that exposes the contact pad and a sidewall of the conductive pattern;
   forming an insulation film lining the contact hole;
   removing a portion of the insulation film on the contact pad to expose the contact pad; and
   forming the conductive plug in the contact hole on the exposed contact pad.

32. The method of according to claim 31, wherein forming the conductive plug in the contact hole comprises:
   depositing a conductive material on the substrate, filling the contact hole; and
   planarizing the substrate to form the conductive plug.

33. The method of according to claim 26, wherein forming the conductive patterns comprises:
   forming a trench in the second insulation layer;
   depositing a conductive material on the substrate and in the trench; and
   planarizing the substrate to form the conductive patterns in the second insulation layer.

34. The method of according to claim 33, wherein depositing a conductive material is preceded by forming a glue layer in the trench.

* * * * *